United States Patent
Kim et al.

(10) Patent No.: US 8,790,775 B2
(45) Date of Patent: Jul. 29, 2014

(54) HEXAGONAL BORON NITRIDE SHEET, METHOD OF PREPARING THE HEXAGONAL BORON NITRIDE SHEET, AND ELECTRONIC DEVICE INCLUDING THE HEXAGONAL BORON NITRIDE SHEET

(71) Applicant: Samsung Electronics Co., Ltd., Suwon-si (KR)

(72) Inventors: Sang-Woo Kim, Seoul (KR); Hyeon-Jin Shin, Suwon-si (KR); Jae-young Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/705,700

(22) Filed: Dec. 5, 2012

(65) Prior Publication Data

US 2013/0140526 A1 Jun. 6, 2013

(30) Foreign Application Priority Data

Dec. 6, 2011 (KR) .................. 10-2011-0129913

(51) Int. Cl.
*H01L 31/042* (2014.01)

(52) U.S. Cl.
USPC ........................................... 428/336

(58) Field of Classification Search
None
See application file for complete search history.

(56) References Cited

U.S. PATENT DOCUMENTS

2010/0218801 A1* 9/2010 Sung et al. .................. 136/244
2011/0256386 A1* 10/2011 Shi et al. ...................... 428/336

FOREIGN PATENT DOCUMENTS

JP 2009298626 A 12/2009
JP 2011077547 A 4/2011

OTHER PUBLICATIONS

Kim, Edwin, et al., "Chemical vapor deposition-assembled graphene field-effect transistor on hexagonal boron nitride," Applied Physics Letters, vol. 98, 262103, 2011, pp. 262103-1-262103-3.
Song, Li, et al., "Large Scale Growth and Characterization of Atomic Hexagonal Boron Nitride Layers," Nano Letters, 2010, vol. 10, pp. 3209-3215.
C.R. Dean, et al., "Boron nitride substrates for high-quality graphene electronics," Nature Nanotechnology, vol. 5, Aug. 22, 2010, 5 pages.
Ivan Naumov, et al., "Unusual Flexoelectric Effect in Two-Dimensional Noncentrosymmetric s p2-Bonded Crystals," Physical Review Letters, 102, 217601 (2009), 4 pages.
J. Slawinska, et al., "Energy gap tuning in graphene on hexagonal boron nitride bilayer system," Physical Review B 81, 155433, (2010), 9 pages.
Jiamin Xue, et al., "Scanning tunnelling microscopy and spectroscopy of ultra-flat graphene on hexagonal boron nitride," Nature Materials, vol. 10, Feb. 13, 2011, p. 282-285.
Kalyan Raidongia, et al., "Synthesis and Characterization of Nanoparticles, Nanotubes, Nanopans, and Graphene-like Structures of Boron Nitride," Israel Journal of Chemistry, 2010, 50, pp. 399-404.
Yumeng Shi, et al., "Synthesis of Few-Layer Hexagonal Boron Nitride Thin Film by Chemical Vapor Deposition," Nano Letters, 2010, 10, pp. 4134-4139.

* cited by examiner

*Primary Examiner* — Zandra Smith
*Assistant Examiner* — Paul Patton
(74) *Attorney, Agent, or Firm* — Cantor Colburn LLP

(57) ABSTRACT

A hexagonal boron nitride sheet having: a two-dimensional planar structure with a $sp^2$ B—N covalent bond, a Van der Waals bond between boron-nitrogen layers, a root mean square surface roughness of about 2 nanometers or less, and a length of about 1 millimeter or greater.

25 Claims, 12 Drawing Sheets

HEXAGONAL BORON NITRIDE SHEET, METHOD OF PREPARING THE HEXAGONAL BORON NITRIDE SHEET, AND ELECTRONIC DEVICE INCLUDING THE HEXAGONAL BORON NITRIDE SHEET

This application claims priority to and the benefit of Korean Patent Application No. 10-2011-0129913, filed on Dec. 6, 2011, and all the benefits accruing therefrom under 35 U.S.C. §119, the content of which is incorporated herein in their entirety by reference.

BACKGROUND

1. Field

The present disclosure relates to a hexagonal boron nitride sheet, a method of preparing the same, and an electronic device including the hexagonal boron nitride sheet, and more particularly to a hexagonal boron nitride sheet that has an area and a quality suitable for application in an electronic device.

2. Description of the Related Art

Hexagonal boron nitride (hereinafter, "h-BN") is a material having a two-dimensional structure which consists of boron and nitrogen atoms in a hexagonal arrangement. h-BN is electrically insulating due to its large band gap of about 5.9 electron volts (eV), and is physically and mechanically stable.

Crystalline h-BN has a hexagonally stacked structure similar to graphite, is able to form very strong bonds, and has lubricating properties. The intrinsic properties of h-BN make h-BN attractive for electronics applications. h-BN has a high thermal conductivity, and sublimes at about 3,000° C. without going through a liquid phase at a specific melting point, and thus is highly stable at a high temperature. h-BN has a very high electrical resistance of about 105 ohms ($\Omega$) at high temperatures, e.g., above 1,000° C., and is chemically stable due to its hexagonal bonding. Also, h-BN has a specific gravity of 2.26, which is relatively low for a ceramic, and thus h-BN is a candidate material for lighter weight aerospace materials and parts.

Therefore, there remains a need for h-BN having a quality and size suitable for envisioned applications.

SUMMARY

Provided is a high-quality hexagonal boron nitride (h-BN) sheet.

Provided is a method of preparing the h-BN sheet.

Provided is an electronic device including the h-BN sheet.

Additional aspects will be set forth in part in the description which follows and, in part, will be apparent from the description.

According to an aspect, an h-BN sheet as a two-dimensional planar structure with a sp$^2$ B—N covalent bond (B—N); a Van der Waals bond between boron-nitrogen layers; a root mean square ($R_{RMS}$) surface roughness of about 2 nanometers (nm) or less; and a length of about 1 millimeter or greater.

The h-BN sheet may include from one to 100 boron-nitrogen layers.

The h-BN sheet may include hexagonal boron nitride with a purity of about 70% or greater, when determined by Raman spectroscopy.

According to another aspect, a method of preparing an h-BN sheet includes: obtaining a metal catalyst in sheet form; first thermally treating the metal catalyst to increase a grain size of the metal catalyst; and second thermally treating and contacting the first thermally treated metal catalyst with a nitrogen source and a boron source to form the hexagonal boron nitride sheet, wherein the nitrogen source and the boron source are the same or different.

The metal catalyst in sheet form after the first thermal treatment may have a mean increase of about at least 100% or greater than a grain area of the metal catalyst before the first thermal treatment.

The metal catalyst in sheet form after the first thermal treatment may have a mean grain area of about 1 square micrometer ($\mu m^2$) or greater.

The metal catalyst in sheet form after the first thermal treatment may have a mean grain area of about 1 $\mu m^2$ to about 1 square centimeter ($cm^2$).

The metal catalyst in sheet form after the first thermal treatment may have a root mean square ($R_{RMS}$) surface roughness of about 7 nanometers (nm) or less.

The first thermal treatment may be performed at a temperature of about a lower temperature to about an upper temperature, wherein the lower temperature is according to Equation 1, lower temperature=(melting point of the metal catalyst×0.60),   Equation 1 and the upper temperature is according to Equation 2, upper temperature=(melting point of the metal catalyst×0.97)   Equation 2.

The metal catalyst in sheet form after the first thermal treatment may have a mean grain area of about 100 $\mu m^2$ to about 5,000 $\mu m^2$.

The metal catalyst in sheet form after the first thermal treatment may have a mean grain area of about 10,000 $\mu m^2$ to about 100,000 $\mu m^2$.

The method may further include polishing at least one surface of the metal catalyst in sheet form after the first thermal treatment.

The polishing may include at least one selected from chemical polishing, physical polishing, chemical mechanical polishing, and electrolytic polishing.

The metal catalyst in sheet form after the polishing may have a root mean square ($R_{RMS}$) surface roughness of about 5 nm or less.

The h-BN sheet obtained using the method have a length of about 1 mm or greater.

The h-BN sheet obtained using the method may include hexagonal boron nitride with a purity of about 70% or greater, when determined by Raman spectroscopy.

The h-BN sheet may include hexagonal boron nitride with a purity of about 70% or greater, when determined by Raman spectroscopy.

The nitrogen source may be at least one selected from among $NH_3$ and $N_2$.

The boron source may be at least one selected from among $BH_3$, $BF_3$, $BCl_3$, $B_2H_6$, $(CH_3CH_2)_3B$, $(CH_3)_3B$, and diborane.

The nitrogen and boron source may be $H_3NBH_3$.

The metal catalyst may be at least one metal selected from nickel (Ni), cobalt (Co), iron (Fe), platinum (Pt), palladium (Pd), gold (Au), aluminum (Al), chromium (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), and zirconium (Zr), and an alloy thereof.

The second thermal treatment may be performed in the presence of at least one selected from an inert gas and hydrogen gas.

According to another aspect, there is provided a hexagonal boron nitride sheet prepared using the above-described method.

According to another aspect, there is provided a stacked structure including the above-described h-BN sheet and graphene.

The stacked structure may be applicable in a variety of electronic devices.

Also disclosed is an electronic device including the stacked structure.

Also disclosed is a transistor including the stacked structure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
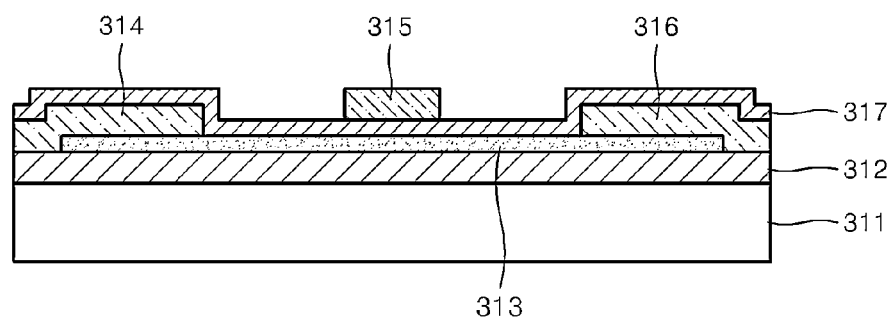
FIG. 1 is a schematic view of an embodiment of a field effect transistor (FET)

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers, and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

According to an aspect of the present disclosure, there is provided a hexagonal boron nitride (h-BN) sheet having an increased area and an improved quality. The area and quality of the h-BN sheet may be suitable for electronics applications.

The h-BN sheet may have a large area and a smooth surface having an improved surface roughness, wherein a dimension, e.g., at least one of a width and a length, of the h-BN sheet may be about 1 millimeter (mm) or greater.

The h-BN sheet may have a purity of 70 weight percent (wt %) or greater, and may contain about 70 wt % or greater h-BN and have a reduced amount of impurities, e.g., an allotrope having a different crystalline structure, and thus may provide improved physical properties when used in a device.

In an embodiment, a large-area h-BN sheet with reduced surface particle size and reduced surface roughness may be prepared by chemical vapor deposition using a surface-modified metal catalyst.

In another embodiment, the high-quality, large-area h-BN sheet has a two-dimensional planar structure and may include a $sp^2$ B—N covalent bond, and Van der Waals bonds between BN layers. In addition, the h-BN sheet may have a reduced surface roughness, and a large area with at least one of a width and a length that are about 1 mm or greater.

A surface roughness of the h-BN sheet is a means of characterizing a degree of irregularities of the sheet surface. The surface roughness is higher when impurity particles or winkles are present on the surface of the h-BN sheet. When fewer impurity particles are present on the surface, the smoother the surface becomes, and the lower the surface roughness of the h-BN sheet.

The surface roughness of the h-BN sheet may be represented as a root mean square ($R_{RMS}$) surface roughness, and in an embodiment, $R_{RMS}$ may be, for example, about 2 nm or less, about 0.01 to about 2 nm, or about 0.5 nm to about 1 nm.

The h-BN sheet may have a large size and a low surface roughness. The area of the h-BN sheet may be defined by a width and a length, or by horizontal and vertical lengths, wherein the width and length are perpendicular and are each perpendicular to a thickness, and wherein the horizontal and vertical directions correspond to the width and thickness directions, respectively. The term "length" refers to the longest dimension of any object. In an embodiment, at least one of the width and the length of the h-BN sheet may be about 1 mm or greater, for example, about 1 centimeter (cm) or greater. The upper limit of the width or the length of the h-BN sheet may vary depending on a size of a chamber in which the h-BN sheet is prepared, and in an embodiment, may be about 1 meter (m) or greater, or 10 m or greater, within the allowable range of the chamber.

The area of the h-BN sheet may be about 0.5 square millimeters ($mm^2$) or greater, and in an embodiment, may be about 1 $mm^2$ or greater, about 10 $mm^2$ or greater, about 1 square centimeters ($cm^2$) or greater, or about 1 $mm^2$ to about 10 square meters ($m^2$). In an embodiment, the area of the h-BN sheet may be about 0.5 $mm^2$ to about 10 $m^2$, specifically about 1 $cm^2$ to about 1 $m^2$.

The h-BN sheet may have any suitable shape, such as a triangular, rectangular, circular, or oval shape, or may have any of a variety of shapes according to a use thereof.

The h-BN sheet may have a thickness of a single atomic h-BN layer, or may have a multiple-layer structure including at least two h-BN layers. In an embodiment, the h-BN sheet may include, for example, from one to about 100 h-BN layers, or from one to about 10 h-BN layers.

The h-BN sheet may have a hexagonal crystalline structure. A purity of the h-BN sheet may be determined from a peak area of a B—N vibrational mode in Raman spectrum of the h-BN sheet.

In general, the composition of a BN structure may be analyzed by Raman spectroscopy using a 514-nm Ar+ ion laser, which provides specific bands for three components: (1) a 1,367 $cm^{-1}$ peak corresponding to the B—N vibrational mode (e.g., an $E_{2g}$ mode) of the h-BN; (2) peaks in a range of 1,322 to 1,350 $cm^{-1}$ corresponding to boron nitride carbon ($B_xC_yN_z$) and/or BN soot; and (3) a 1,304 $cm^{-1}$ peak corresponding to T2 symmetry of cubic BN (c-BN).

A purity of the h-BN may be calculated using an area ratio of the 1,367 $cm^{-1}$ peak of the h-BN to a total area of the three peaks at 1,367 $cm^{-1}$, 1,322 to 1,350 $cm^{-1}$, and 1,304 $cm^{-1}$. The areas of these peaks may be calculated using any suitable method, for example, by weighing a corresponding peak cut out from the Raman spectrum, or by analyzing the Raman spectrum using a peak area analysis program.

According to these methods, the h-BN sheet may have a purity of about 70% or greater, for example, about 90% or greater, about 70% to about 99.99%, specifically about 93% to about 99.99%, or about 95% to about 99.99%, or about 98% to about 99.99%, based on an area of the 1,367 $cm^{-1}$ peak to total area of the three peaks in the Raman spectrum.

In another embodiment, a purity of the h-BN sheet may be determined based on a shape of the 1,367 $cm^{-1}$ peak in the Raman spectrum. In particular, when an amount of an allotrope such as cubic boron nitride (c-BN) or amorphous boron nitride (a-BN), or a heterogeneous component such as boron nitride carbon ($B_xC_yN_z$) and/or BN soot is greater than that of h-BN, due to strong peak intensities of peaks corresponding to these impurities, the specific three peak bands for area calculation may overlap so that the 1,367 $cm^{-1}$ peak of the h-BN may have a greater full width at half maximum (FWHM). On the other hand, when an amount of h-BN is relatively high, e.g., the h-BN is relatively pure, peak overlapping is reduced so that the 1,367 $cm^{-1}$ peak of the h-BN may have a smaller FWHM. Accordingly, the crystallinity of the h-BN sheet may be determined based on the FWHM of the 1,367 $cm^{-1}$ peak.

In an embodiment, the h-BN sheet may have a FWHM value in the Raman spectrum of about 17 or less, for example, specifically about 5 to 17, more specifically about 16.5 to about 12, when a desirable amount of h-BN is present.

In an embodiment, the high-quality, large-area h-BN sheet may be prepared using chemical vapor deposition along with a surface modification of a metal catalyst used in the method.

h-BN sheets can be prepared by mechanical delamination, e.g., by mechanical single layer delamination from a bulk phase, a chemical solution method in which a chemical reaction between monocrystalline layers is induced to obtain an h-BN layer, or chemical vapor deposition that involves crystallization on a metal crystal after high-temperature synthesis from a source material to obtain an h-BN sheet.

However, synthesis of the h-BN sheet using the mechanical delamination or chemical solution method may result in an h-BN sheet having a dimension of microns (μm), i.e., a size that is too small to be suitable for manufacturing an electronic device or to be manufactured on a mass scale for a commercial purpose. Chemical vapor deposition using an untreated metal catalyst may result in an h-BN sheet with a number of particles and/or wrinkles on surfaces, which can degrade electrical characteristics of an electronic device manufactured using the h-BN sheet.

In an embodiment, a suitably sized h-BN sheet with fewer defects may be prepared using chemical vapor deposition using a metal catalyst having a surface modified by thermal treatment and/or polishing.

To this end, in an embodiment, the h-BN sheet preparation method may include obtaining a metal catalyst having a sheet form with an increased grain size through a first thermal treatment in a chamber, and forming the h-BN sheet on the metal catalyst through a second thermal treatment while contacting the metal catalyst with a nitrogen source and a boron source in the form of a vapor in the chamber.

In an embodiment, a method of preparing a hexagonal boron nitride (h-BN) sheet comprises: obtaining a metal catalyst in sheet form; first thermally treating the metal catalyst to increase a grain size of the metal catalyst; and second thermally treating and contacting the first thermally treated metal catalyst with a nitrogen source and a boron source to form the hexagonal boron nitride sheet, wherein the nitrogen source and the boron source are the same or different.

While not wanting to be bound by theory, it is understood that the first thermal treatment in the preparation method controls the morphology of surface of the metal catalyst in sheet form.

A metal catalyst normally has a rough surface, so that h-BN grown on a surface of the metal catalyst may have a rough surface that is understood to capture an undesirable quantity of impurity particles, resulting in degraded physical characteristics. Thus, to prevent such deterioration in physical characteristics, a surface of the metal catalyst may be first thermally treated to provide a smooth surface before the growing of the h-BN thereon so that the h-BN sheet grown thereon may also have a smooth surface with fewer impurity particles.

In general, a metal catalyst used in chemical vapor deposition has a polycrystalline structure, and thus a considerable amount of small gains, each delimited by a grain boundary, may be present on a surface thereof. While not wanting to be bound by theory, it is understood that the presence of a large number of grains and grain boundaries may be a primary cause of surface quality deterioration in h-BN.

Thermal treatment of metal catalyst in the first thermal treatment before the synthesis of h-BN may increase the grain size of the metal catalyst, ultimately improving the surface quality of the h-BN sheet. That is, heating the metal catalyst at high temperatures to rearrange atoms in the metal catalyst may increase the size of the grains, which may have a same or similar crystal face.

The grain size of the metal catalyst may be determined using a mean area of individual grains. The metal catalyst before the first thermal treatment with a distribution of smaller grains may have a smaller mean grain area than the metal catalyst with an increased grain size after the first thermal treatment. The mean grain area refers to an arithmetic mean of the areas of the individual unit grains, not a total area of the grains in the metal catalyst.

A mean area measurement method for individual unit grains of a surface of the metal catalyst may be any suitable method known in the art. For example, a mean area of the unit grains may be calculated by counting the number of grains within a selected area of an optical surface image of the metal catalyst, for example, within a 1 cm×1 cm region of the optical surface image, and dividing the selected area of the optical surface image by the number of the grains.

In an embodiment, the unit grains of the metal catalyst in sheet form after the first thermal treatment may have a mean area of about 1 μm$^2$ or greater, for example, a mean area of about 1 μm$^2$ to about 1 cm$^2$, specifically about 2 μm$^2$ to about 10 mm$^2$, more specifically about 4 μm$^2$ to about 1 mm$^2$.

The grains of the metal catalyst in sheet form after the first thermal treatment have a larger mean area as compared with those before the first thermal treatment by a mean increase of at least about 100% or greater, for example, about 100% to about 1,000%, or about 150% to about 700%. In an embodiment, the mean grain area of the catalyst after the first thermal treatment is about 1 to about 10, specifically about 2 to about 8, more specifically about 3 to about 6 times the mean grain area before the first thermal treatment.

The first thermal treatment may be performed in a high-temperature chamber at about 500° C. to about 3,000° C., specifically about 550° C. to about 2500° C., more specifically about 600° C. to about 2000° C. for about 10 minutes to about 24 hours, specifically about 20 minutes to about 20 hours. The first thermal treatment may be performed at a temperature lower than the melting point of the metal catalyst, for example, in a temperature range of about a lower temperature to about an upper temperature, wherein the lower temperature is according to Equation 1:

lower temperature=(melting point of the metal catalyst×0.60)   Equation 1, and the upper temperature is according to Equation 2:

upper temperature=(melting point of the metal catalyst×0.97)   Equation 2.

In an embodiment, the lower temperature is about 0.6 to about 0.9, specifically about 0.7 to about 0.8 of the melting point of the metal catalyst, and the upper temperature is about 0.9 to about 0.99, specifically about 0.92 to about 0.97 of the melting point of the metal catalyst.

The closer to the melting point of the metal catalyst the temperature of the first thermal treatment is, the larger the grain size of the metal catalyst may become. For example, unit grains of the metal catalyst after the first thermal treatment, which may be at a temperature of (the melting point of the metal catalyst×0.60), may have a mean area of about 100 μm$^2$ to about 5,000 μm$^2$. Unit grains of the metal catalyst after the first thermal treatment, which may be at a temperature of (the melting point of the metal catalyst×0.97) may have a mean area of about 10,000 μm$^2$ to about 100,000 μm$^2$. The larger the grain size of the metal catalyst in sheet form becomes through the first thermal treatment, the lower the resulting surface roughness of the metal catalyst. In an embodiment, the metal catalyst may have a surface roughness of about 7.0 nm or less, or about 0.01 nm to about 7.0 nm, specifically about 0.5 nm to about 5 nm.

The interior atmosphere of the chamber may be maintained as an inert atmosphere and/or a reducing atmosphere during the first thermal treatment, as is further disclosed below.

The above-described first thermal treatment may be performed for a single cycle. In another embodiment, the first thermal treatment may be repeated several times, e.g., to obtain a larger grain size. For example, the first thermal treatment may be repeated two or three times to obtain a metal catalyst with an increased grain size. In an embodiment, the first thermal treatment may be repeated 1 to about 5 times, specifically about 2 to about 8 times.

After the increasing of the grain size through the first treatment, to control for the surface of the metal catalyst, the surface of the metal catalyst may be further processed by polishing to provide a smoother surface.

The polishing may comprise at least one selected from chemical polishing, physical (e.g., mechanical) polishing, chemical-mechanical polishing, and electrolytic polishing.

The chemical polishing may involve dipping the metal catalyst in sheet form in a selected etchant for a selected time. The etchant is not limited to a specific kind of etchant, and may be any of suitable etchant known in the art to be compatible with the metal catalyst. For example, when the metal catalyst is copper, suitable examples of the etchant are acid solutions such as $FeCl_3$, $HNO_3$, or the like, basic solutions such as $H_2O_2$, $NH_3$, or the like, and organic acids such as potassium peroxymonosulfate, e.g., Oxone®. These etchants may be used in an appropriate concentration and diluted with, for example, deionized water, if desired.

The physical polishing is a process of wiping a polishing agent on the surface of the metal catalyst in sheet form. For example, after disposing a polishing agent comprising nanoparticles on a polishing rod, the surface of the metal catalyst may be processed while being rotated with the polishing rod in contact with the metal catalyst.

The electrolytic polishing is a process of removing impurities from the surface of the metal catalyst through electrolysis using the metal catalyst as an electrode.

The chemical-mechanical polishing is a process of wiping, for example, a cloth or leather with a chemical polishing etchant, on the surface of the metal catalyst.

The above-described polishing process may further smooth the surface of the metal catalyst having an increased grain size from the first thermal process, thus further reducing the surface roughness of the metal catalyst. The metal catalyst in sheet form with the smoother surface from the additional polishing may have a reduced surface roughness, for example, a $R_{RMS}$ of about 5 nm or less, or of about 0.01 to about 5 nm, specifically about 0.02 to about 4.0 nm.

As a result of the surface treatment of the metal catalyst including the first thermal treatment and the chemical polishing, the metal catalyst may have an increased grain size and a reduced surface roughness. When an h-BN sheet is grown using this surface-treated metal catalyst, an h-BN sheet may have an improved surface condition.

The metal catalyst for use in these processes may be any of a variety of metals used in deposition of boron nitride. For example, the metal catalyst may be at least one metal selected from the group consisting of nickel (Ni), cobalt (Co), iron (Fe), platinum (Pt), palladium (Pd), gold (Au), aluminum (Al), chromium (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), and zirconium (Zr), or an alloy thereof. The metal catalyst may have a thickness of about 1 mm or less, and in some embodiments, may have a thickness of about 500 µm to about 10 µm.

The size of an h-BN sheet grown on the metal catalyst may be dependent upon the size of the metal catalyst, and thus a large-area h-BN sheet may be obtained by controlling the size of the metal catalyst. In some embodiments, with regard to the size of the metal catalyst, at least one of the width and length (i.e., the horizontal length and/or vertical length) may be about 1 mm or greater, or about 1 m or 10 m or greater at a maximum.

The shape of an h-BN sheet grown on the metal catalyst may also be dependent upon the shape of the metal catalyst. For example, when the metal catalyst is prepared in a selected pattern, the h-BN sheet grown on the surface of the metal catalyst may also be in the same pattern as the metal catalyst.

A high-quality, large-area h-BN sheet may be formed in a second thermal treatment while a nitrogen source and a boron source, both of which are in a vapor phase, are contacted with the metal catalyst, which has been first thermally treated and/or polished as described above. The contacting may be in a chamber. In an embodiment, a method of preparing a hexagonal boron nitride sheet comprises obtaining a metal catalyst in sheet form; first thermally treating the metal catalyst to increase a grain size of the metal catalyst; and second thermally treating and contacting the first thermally treated metal catalyst with a nitrogen source and a boron source to form the hexagonal boron nitride sheet, wherein the nitrogen source and the boron source are the same or different. In an embodiment, the nitrogen source and the boron source are each a vapor, i.e., in the gas phase and below a critical point thereof, during the contacting.

The nitrogen source and boron source may be supplied at a constant flow rate, and may be combined with an inert atmosphere and/or a reducing atmosphere. The inert atmosphere may be created using an inert gas such as argon gas or helium gas. The reducing atmosphere may be created using hydrogen gas. When the inert gas and hydrogen gas are used as a mixture, an amount of the inert gas may be about 60 volume percent (volume %) to about 95 volume % of a total volume of the chamber, and an amount of the hydrogen gas may be from about 5 volume % to about 40 volume % of the total volume of the chamber.

The combination of the inert gas and/or hydrogen gas, the vapor phase nitrogen source, and the boron source may be supplied, for example, at a flow rate of about 10 standard cubic centimeters per minute (sccm) to about 10,000 sccm, specifically about 20 sccm to about 5,000 sccm, more specifically about 40 sccm to about 3,000 sccm. In an embodiment, the inert gas and/or hydrogen gas, the vapor phase nitrogen source, and the boron source may each individually be supplied at a flow rate of about 10 standard cubic centimeters per minute (sccm) to about 10,000 sccm, specifically about 20 sccm to about 5,000 sccm, more specifically about 40 sccm to about 3,000 sccm. In particular, the vapor phase nitrogen source and boron source may be supplied in a 1:1 stoichiometric ratio, for example, at a flow rate of about 1 sccm to about 100 sccm, specifically about 2 sccm to about 10 sccm.

The nitrogen source is not limited to a specific type of nitrogen source, and may be any of a variety of nitrogen sources able to supply nitrogen in the form of a vapor. In an embodiment, the nitrogen source may be at least one of $NH_3$ and $N_2$.

The boron source is not specifically limited, and may be any of a variety of boron sources able to supply boron in the form of a vapor. In an embodiment, the boron source may be at least one selected from among $BH_3$, $BF_3$, $BCl_3$, $B_2H_6$, $(CH_3CH_2)_3B$, $(CH_3)_3B$, and diborane. In an embodiment, at least one of the nitrogen and boron sources is able to supply both nitrogen and boron, and may be $H_3NBH_3$, $(BH)_3(NH)_3$, or a mixture thereof.

The nitrogen source and boron source may be supplied in the form of a vapor into the chamber. Alternatively, the nitrogen source and boron source can be a solid. For example, a solid nitrogen- and boron-containing material may be vaporized in an external vessel, and the vapor delivered contacted with the metal catalyst.

In particular, after heating a solid nitrogen- and boron-containing compound placed in an external vessel to a selected temperature to vaporize (i.e., sublime) the nitrogen- and boron-containing compound, the vapor of the nitrogen-containing and boron-containing compound may be supplied into the chamber containing the metal catalyst.

The vapor phase nitrogen and boron source obtained through vaporization in the external source may be supplied into the chamber together with nitrogen gas. In this regard, a temperature of the external vessel and a flow rate of the nitrogen gas may be appropriately selected to provide a suitable amount of nitrogen and boron into the chamber, thus ultimately controlling growth of the h-BN.

For example, the solid nitrogen- and boron-containing compound placed in the external vessel may be an ammonia-borane ($NH_3$—$BH_3$) compound, e.g., borazane. The ammonia-borane compound vaporizes at about 130° C., based on which the temperature of the external vessel may be appropriately adjusted to control the amounts of vaporized $NH_3$ and $BH_3$.

The second thermal treatment as a process for growing h-BN on the surface of the metal catalyst may be performed at an appropriate temperature for a selected time. For example, the second thermal treatment may be performed at a temperature of about 700° C. to about 1,200° C., specifically about 750° C. to about 1,100° C., and in an embodiment, at a temperature of about 700° C. to a melting point of the metal catalyst, for about 1 minute to about 2 hours. A selected cooling process may be performed on a product of the second thermal treatment. This cooling process may uniformly grow and arrange h-BN on the metal catalyst. The cooling process may be performed, for example, at a rate of about 10° C. to about 100° C. per minute, specifically at about 20 to about 80° C. per minute. In the cooling process, nitrogen gas as an inert gas may be supplied at a constant flow rate. The cooling process may be a natural cooling process, which may be implemented by stopping operation of a heat source or by removing the heat source from the chamber.

The h-BN sheet resulting from the cooling process may include any number of layers, for example, from a single layer to about 100 layers. For example, the h-BN sheet may include from a single layer to about 20 BN layers, and in an embodiment, from a single BN layer to about 15 BN layers, and in another embodiment, from a single BN layer to about 10 BN layers.

The second thermal treatment and cooling process may be performed for one cycle. In another embodiment, the second thermal treatment and cooling process may be repeated several times to obtain an h-BN sheet having a suitable structure with more layers. For example, the second thermal process may be repeated twice or three times to improve the crystallinity and purity of the h-BN sheet. In an embodiment, the second thermal treatment and cooling process may be performed 1 to about 15 times, specifically about 2 to about 13 times.

Heat sources for the first and second thermal treatment are not limited, and may be induction heat, radiant heat, a laser, infrared (IR) heat, microwaves, plasma, ultraviolet (UV) rays, or surface plasmon heat. Such a heat source may be attached to or directed towards the chamber to increase the temperature in the chamber to a selected temperature.

After the second thermal treatment and cooling process, removal of the metal catalyst may be further performed. Since the metal catalyst is a metal layer, the metal catalyst may be removed by an acid treatment. The acid treatment may be performed using hydrochloric acid, sulfuric acid, nitric acid, or a combination thereof in a selected concentration. In an embodiment, a product of the second thermal treatment and cooling process may be immersed in such an acid solution for a selected time to remove the metal catalyst, thereby providing an h-BN sheet. After the removal of the metal catalyst through the acid treatment, a coating layer using resin, such as polymethyl-(meth)acrylate, may be disposed on the h-BN sheet to facilitate a subsequent transfer process. The coating layer may be removed using an organic solvent such as acetone.

As is further described above, the composition of the resulting h-BN sheet may be analyzed by Raman spectroscopy using a 514-nm $Ar^+$ ion laser, which provides specific bands for three components: (1) a 1,367 $cm^{-1}$ peak corresponding to the B—N vibrational mode ($E_{2g}$) of the h-BN; (2) peaks in a range of 1,322 to 1,350 $cm^{-1}$ corresponding to boron nitride carbon ($B_xC_yN_z$) and/or BN soot; and (3) a 1,304 $cm^{-1}$ peak corresponding to T2 symmetry of cubic BN (c-BN).

A purity of the h-BN may be calculated using a ratio of the area of the 1,367 $cm^{-1}$ peak of h-BN to a total area of the three peaks at 1,367 $cm^{-1}$, 1,322 to 1,350 $cm^{-1}$, and 1,304 $cm^{-1}$. The h-BN sheet obtained by the above-described method may have a purity of about 70% to about 100%, and in an embodiment, may have a purity of about 90% or greater, about 93% or greater, about 95% or greater, or about 98% to about 99.99%.

In another embodiment, a purity of the h-BN sheet may be determined based on a shape of the 1,367 $cm^{-1}$ peak in the Raman spectrum. In particular, when an amount of an allotrope such as cubic boron nitride (c-BN) or amorphous boron nitride (a-BN), or a heterogeneous component such as boron nitride carbon ($B_xC_yN_z$) and/or BN soot is greater than that of h-BN, due to strong peak intensities of these peaks, the specific three peak bands corresponding to these species for area calculation may overlap so that the 1,367 $cm^{-1}$ peak of the h-BN may have a greater FWHM. On the other hand, when an amount of h-BN is relatively high, e.g., the h-BN is relatively pure, peak overlapping is reduced so that the 1,367 $cm^{-1}$ peak of the h-BN may have a smaller FWHM. Accordingly, crystallinity of the h-BN sheet may be determined based on the FWHM of the 1,367 $cm^{-1}$ peak.

In an embodiment, the h-BN sheet may have a FWHM in the Raman spectrum of about 17 or less, for example, specifically about 16.5 to about 12, when a desirable amount of h-BN is present.

The h-BN sheet obtained by chemical vapor deposition using the metal catalyst, which is thermally treated as described above, may have a root mean square ($R_{RMS}$) surface roughness of about 2 nm or less, for example, a RMS surface roughness of about 0.01 to about 2 nm, specifically about 0.5 nm to about 1 nm.

As used herein, the term "h-BN" means a hexagonal boron nitride, which has a two-dimensional planar structure with $sp^2$ B—N covalent bonds, and Van der Waals bonds between BN layers.

The h-BN sheet prepared as described above may have a large area, wherein the width and the length may each independently be about 1 mm or greater, for example, about 10 mm or greater, or about 10 mm to 1,000 mm. The size of the metal catalyst may be selected to provide a large-area h-BN sheet. Since the nitrogen source and boron source are supplied in a vapor phase, the shape of the metal catalyst is not specifically limited. Any metal catalyst with a suitable 3-dimensional shape may be used.

The h-BN sheet obtained as described above may have a smooth surface with fewer defects, and thus may be used in a variety of electronic devices. For example, due to having a physically and mechanically stable structure and improved insulating characteristics and transparency, the h-BN sheet may be used as an insulating layer, for example, in a solar cell or a display device.

While not wanting to be bound by theory, it is understood that because h-BN has a small lattice mismatch of about 1.7% with graphene and a structure without a dangling bond, the h-BN sheet does not contain charged impurities on surfaces thereof, and thus may be used instead of silicon dioxide ($SiO_2$) as a support in a graphene-based electronic device. The desirable properties of the h-BN may improve performance of the graphene-based electronic device without any significant performance deterioration in the graphene, due to the improved transparency and flexibility of the h-BN sheet.

In an embodiment, a stacked structure of the h-BN and graphene may be used in a variety of electronic devices, for example, in a sensor, a bipolar junction transistor (BJT), a field effect transistor (FET), a heterojunction bipolar transistor (HBT), a single-electron transistor, a light-emitting diode (LED), or an organic light-emitting diode (OLED). A stacked structure of the h-BN sheet and graphene may be used as a channel layer of these devices, and the h-BN sheet may be used, for example, as a buffer layer between an electrode and the channel layer.

FIG. 1 is a schematic cross-sectional view of an embodiment of a FET. Referring to FIG. 1, a silica substrate 312 and a graphene layer 313 as a channel layer are sequentially disposed on the substrate 311. A source electrode 314 and a drain electrode 316 are disposed on the left and right sides, respectively, with a gate electrode 315 on an insulating layer 317 between the source electrode 314 and the drain electrode 316. A current flow across the source electrode 314 and the drain electrode 316 may be controlled by applying a voltage to the gate electrode 315. That is, the graphene layer 313 may form a channel region, and a current flow between the source electrode 314 and the drain electrode 316 may be controlled by the voltage applied to the gate electrode 315 to turn the FET on or off.

The high-quality, large-area h-BN sheet disclosed above may be used as the insulating layer 317 in the FET.

Figure 2:
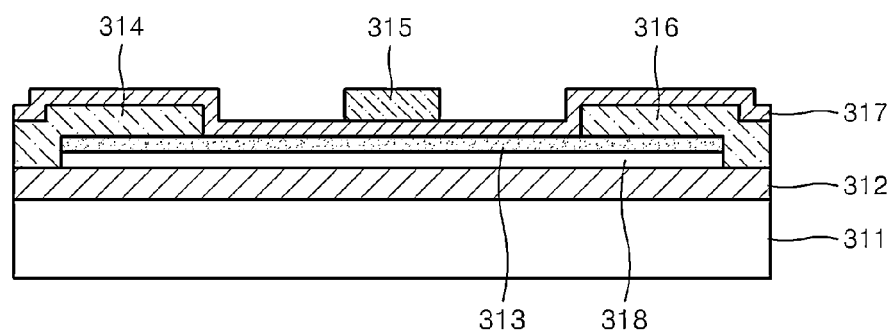
FIG. 2 is a schematic view of another embodiment of a FET.

FIG. 2 is a schematic cross-sectional view of another embodiment of a FET. In the embodiment of FIG. 2, to control scattering of charges migrating from the channel layer 313 caused by a surface roughness of the silica substrate 312 and a dangling bond, a buffer layer 318 may be disposed between the channel layer 313 and the silica substrate 312, wherein the buffer layer 318 may be an h-BN sheet as disclosed above. In an embodiment, to improve injection efficiency, the buffer layer 318 may be disposed between the channel layer 313 and the insulating layer 317, wherein the buffer layer 318 may be an h-BN sheet as disclosed above.

An exemplary embodiment will now be described in more detail with reference to the following examples. However, these examples are for illustrative purposes only and shall not limit the scope of the disclosed embodiments.

Example 1

First Thermal Treatment

A copper foil of a size of 2 cm×10 cm with a thickness of about 125 μm was washed with deionized (DI) water. After being placed in a center of a furnace, the copper foil was heated at about 1,020° C. for about 2 hours using an induction heat source along with a supply of $Ar/H_2$ (15 volume % $H_2$, 85 volume % Ar) at about 500 standard cubic centimeters per minute (sccm), and the furnace was cooled to room temperature.

Chemical Polishing Process

After being removed from the chamber, the copper foil was subjected to chemical polishing in which a surface of the copper foil was rubbed with a gauze moistened with an etchant solution of 1 milliliter (mL) of a copper etchant (Transene, type1, available from TRANSENE COMPANY, INC., USA) in 9 mL of deionized (DI) water. Subsequently, the copper foil was washed with DI water.

Growing h-BN (Second Thermal Treatment)

Figure 3:
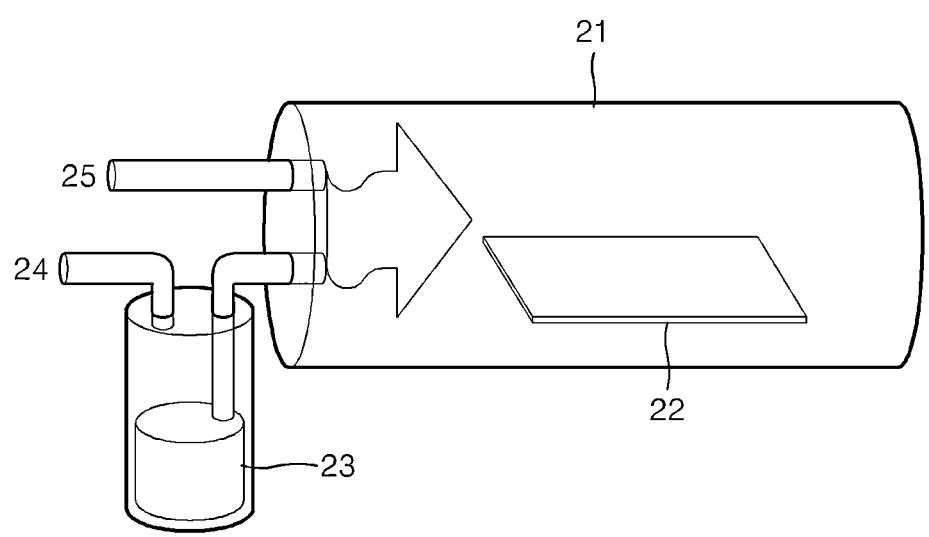
FIG. 3 is a schematic diagram illustrating an embodiment of a chemical vapor deposition (CVD) process.

FIG. 3 is a schematic view of a chemical vapor deposition (CVD) system for growing h-BN.

Referring to FIG. 3, the copper foil 22 after the first thermal treatment and chemical polishing was placed in a CVD chamber 21, the temperature of the chamber 21 was gradually increased to about 1,000° C. for about 2.5 hours using an induction heat source along with a supply of $Ar/H_2$ mixed gas 25 (20 volume % $H_2$, 80 volume % Ar) at a flow rate of about 100 sccm.

Subsequently, ammonia borane ($NH_3$—$BH_3$) as a source material placed in a heating chamber 23 was heated to about 110-130° C. to sublimate along with a supply of nitrogen gas 24, and was then supplied into the CVD chamber 21 to grow h-BN for about 30 minutes.

During the growing of the h-BN, the $Ar/H_2$ mixed gas 25 was supplied into the CVD chamber 21 at about 1,000° C. at about 75 sccm.

Cooling Process

After the growing of the h-BN was complete, the heat source was removed, and the CVD chamber 21 was cooled to about 180° C. along with a supply of the $Ar/H_2$ mixed gas 25 at a rate of about 100 sccm for about 4 hours.

Separation Process

After being coated with polymethylmethacrylate (PMMA), the h-BN sheet grown on the copper foil was dipped in a copper etchant (Transene, type1) to remove the copper foil from the h-BN sheet. After the removal of the copper foil, the h-BN sheet coated with PMMA was washed with DI water several times to fully remove the remaining etchant.

Comparative Example 1

Growing h-BN

A copper foil having a size of 2 cm×10 cm with a thickness of about 125 μm was washed with DI water. After a copper foil was placed into the CVD chamber 21, the temperature of the chamber 21 was gradually increased to about 1,000° C. for about 2.5 hours using an induction heat source along with a supply of $Ar/H_2$ mixed gas 25 (20 volume % $H_2$, 80 volume % Ar) at a flow rate of about 100 sccm.

Subsequently, ammonia borane ($NH_3$—$BH_3$) as a source material placed in a heating chamber 23 was heated to about 110-130° C. to sublimate along with a supply of nitrogen gas 24, and was then supplied into the CVD chamber 21 to grow h-BN for about 30 minutes.

During the growing of h-BN, the $Ar/H_2$ mixed gas 25 was supplied into the CVD chamber 21 at about 1,000° C. at about 75 sccm.

Cooling Process

After the growing of the h-BN was complete, the heat source was removed, and the CVD chamber 21 was cooled to about 180° C. along with a supply of the $Ar/H_2$ mixed gas 25 at a rate of about 100 sccm for about 4 hours.

Separation Process

After being coated with polymethylmethacrylate (PMMA), the h-BN sheet grown on the copper foil was dipped in a copper etchant (Transene, type1) to remove the copper foil from the h-BN sheet. After the removal of the copper foil, the h-BN sheet coated with PMMA was washed with DI water several times to fully remove the remaining etchant.

Example 2

First Thermal Treatment

A copper foil of a size of 2 cm×10 cm with a thickness of about 125 μm was washed with DI water. After being placed in a center of a furnace, the copper foil was heated at about 1,020° C. for about 2 hours using an induction heat source along with a supply of Ar/$H_2$ (15 volume % $H_2$, 85 volume % Ar) at about 500 sccm, and the furnace was cooled to room temperature.

Growing h-BN

After undergoing the first thermal treatment, the copper foil was placed into the CVD chamber 21, the temperature of the chamber 21 was gradually increased to about 1,000° C. for about 2.5 hours using an induction heat source along with a supply of Ar/$H_2$ mixed gas 25 (20 volume % $H_2$, 80 volume % Ar) at a flow rate of about 100 sccm.

Subsequently, ammonia borane ($NH_3$—$BH_3$) as a source material placed in a heating chamber 23 was heated to about 110-130° C. to sublimate along with a supply of nitrogen gas 24, and was then supplied into the CVD chamber 21 to grow h-BN for about 30 minutes.

During the growing of the h-BN, the Ar/$H_2$ mixed gas 25 was supplied into the CVD chamber 21 at about 1,000° C. at about 75 sccm.

Cooling Process

After the growing of the h-BN was complete, the heat source was removed, and the CVD chamber 21 was cooled to about 180° C. along with a supply of the Ar/$H_2$ mixed gas 25 at a rate of about 100 sccm for about 4 hours.

Separation Process

After being coated with polymethylmethacrylate (PMMA), the h-BN sheet grown on the copper foil was dipped in a copper etchant (Transene, type1) to remove the copper foil from the h-BN sheet. After the removal of the copper foil, the h-BN sheet coated with PMMA was washed with DI water several times to fully remove the remaining etchant.

Experimental Example 1

Grain Size Analysis

Figure 4:
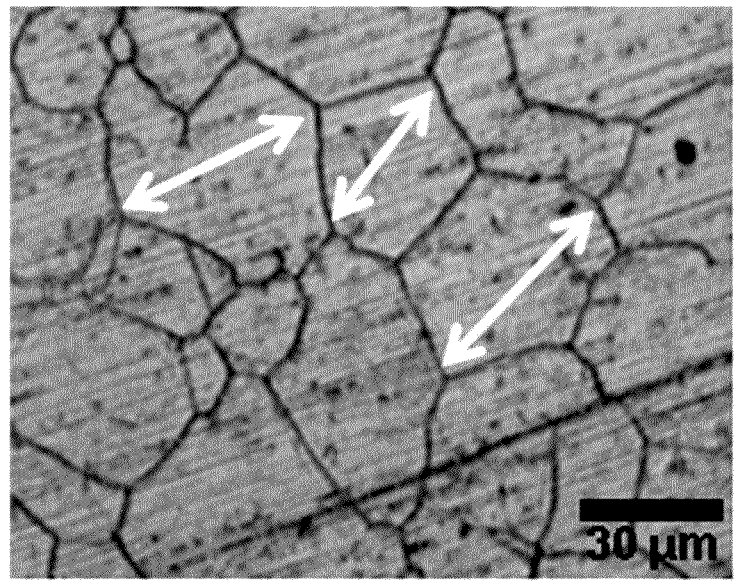
FIG. 4 is an optical surface image of a copper foil before a first thermal treatment in Example 1.
Figure 5:
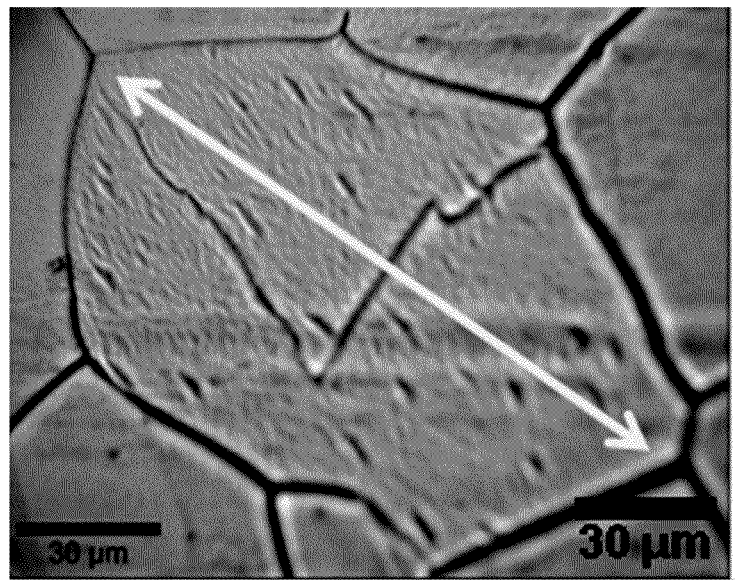
FIG. 5 is an optical surface image of the copper foil after the first thermal treatment in Example 1.

FIGS. 4 and 5 are optical surface images of the copper foil before and after the first thermal treatment in Example 1, respectively.

Referring to FIG. 4, the copper foil before the first thermal treatment was found to have grains having a largest dimension of about 30 μm or less. As shown in FIG. 5, the copper foil after the first thermal treatment was found to have grains having a largest dimension of about 120 μm.

These results indicate an increase in grain size of the copper foil due to the first thermal treatment. There was about a 2,000% increase in total grain area of the copper foil after the first thermal treatment as compared with before the first thermal treatment.

Experimental Example 2

Surface Change Condition Analysis

Figure 6:
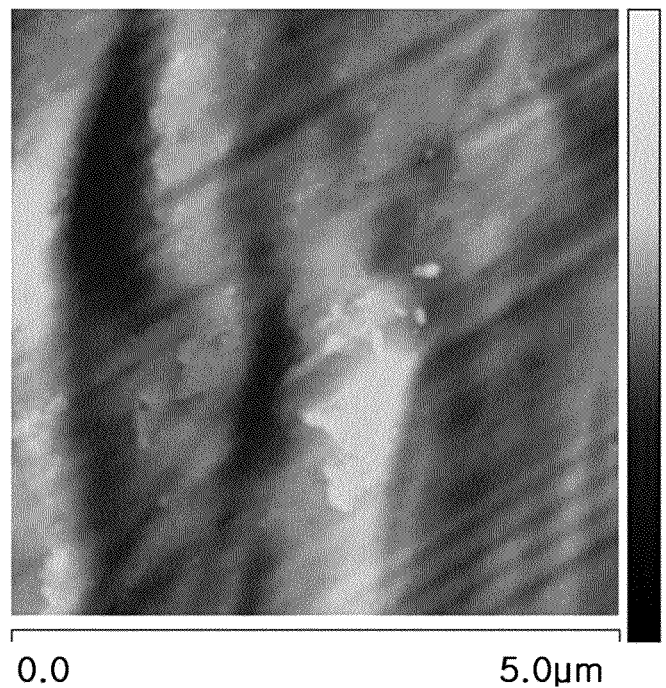
FIG. 6 is an atomic force microscopic (AFM) image of an untreated copper foil in Example 1.
Figure 7:
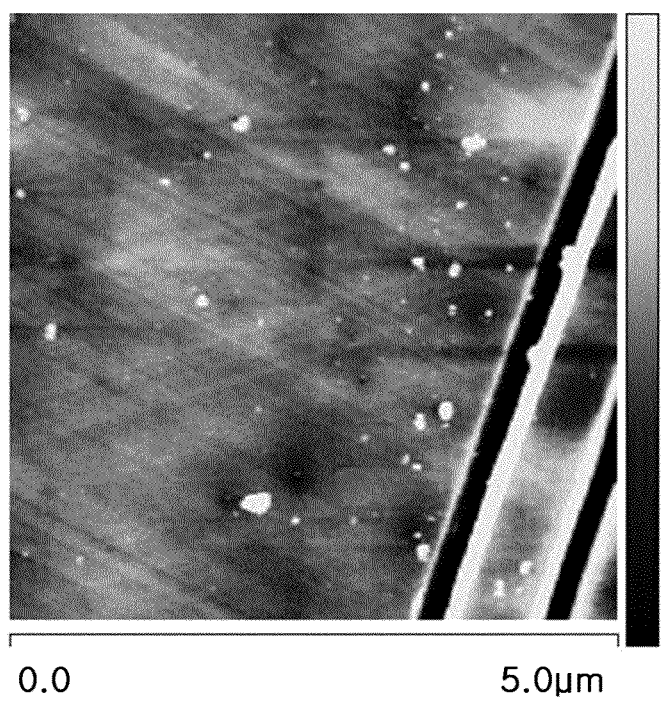
FIG. 7 is an AFM image of the copper foil after the first thermal treatment in Example 1.
Figure 8:
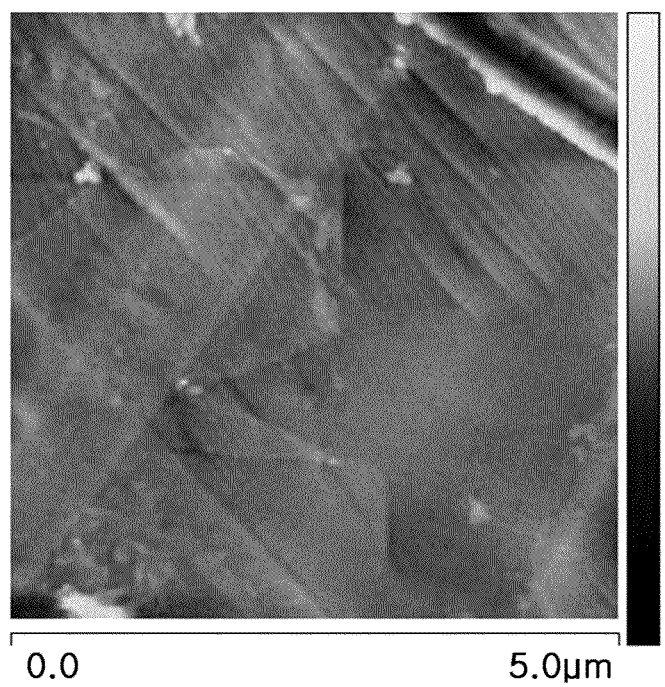
FIG. 8 is an AFM image of the copper foil after the first thermal treatment and chemical polishing in Example 1.

In Example 1, a surface condition of the copper foil was observed after each process by atomic force microscopy (AFM), i.e., before any treatment, after the first thermal treatment, and after the first thermal treatment and chemical polishing. The results are shown in FIGS. 6, 7 and 8. These three samples of the copper foil were found to have a root mean square ($R_{RMS}$) surface roughness of about 25.8 nm, about 7.4 nm, and about 4.24 nm, respectively.

The copper foil of FIG. 7, which underwent the first thermal treatment, was found to have a reduced surface roughness as compared with the untreated copper foil of FIG. 6. Numerically, the surface roughness was reduced from about 25.8 nm to about 7.4 nm.

The copper foil of FIG. 8, which underwent both the first thermal treatment and chemical polishing, was found to have a further reduced surface roughness as compared with the copper foil of FIG. 7 only after the first thermal treatment, wherein, numerically, the surface roughness was reduced from about 7.4 nm to about 4.24 nm.

These results indicate that the surface condition of the copper foil may be effectively controllable and the first thermal treatment and chemical polishing are effective in controlling the surface condition of the copper foil.

Experimental Example 3 h-BN Surface Analysis

Figure 9:
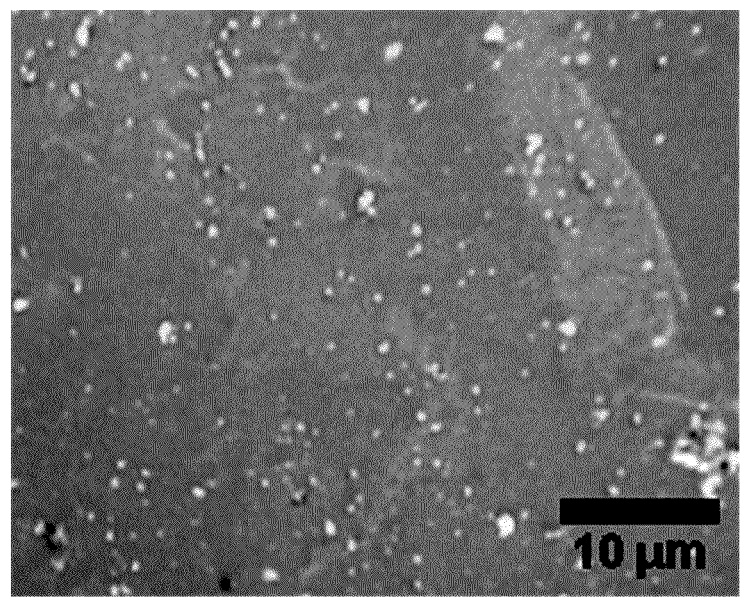
FIG. 9 is an optical surface image of a hexagonal boron nitride (h-BN) sheet obtained in Comparative Example 1.
Figure 10:
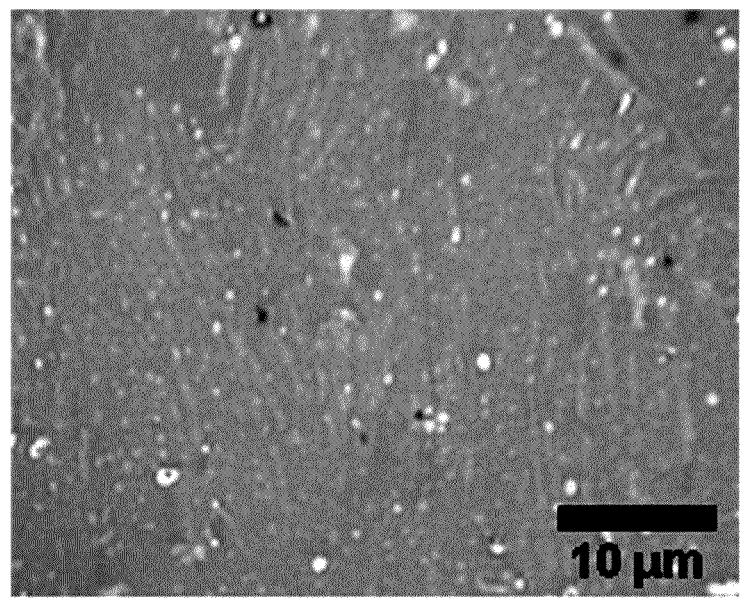
FIG. 10 is an optical surface image of an h-BN sheet obtained in Comparative Example 2.
Figure 11:
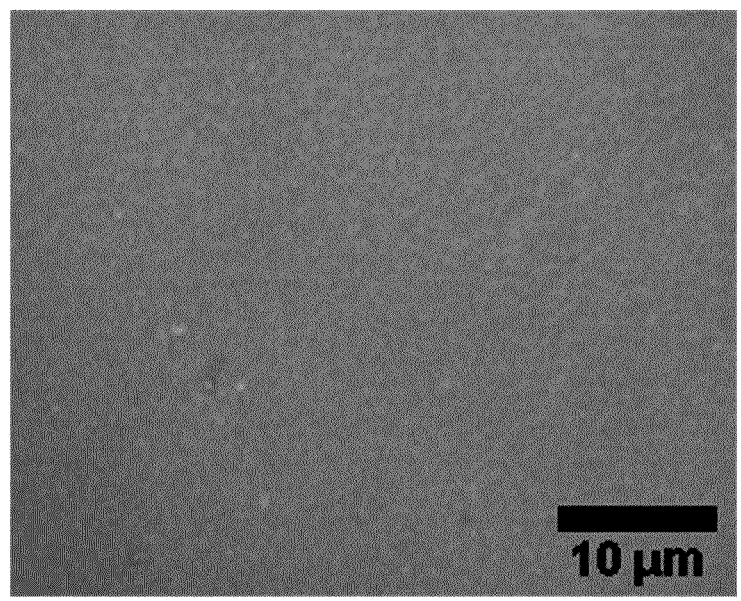
FIG. 11 is an optical surface image of an h-BN sheet obtained in Example 1.

FIGS. 9, 10 and 11 are optical surface images of h-BN sheets of Comparative Example 1, and Examples 1 and 2, respectively.

Referring to FIG. 9, the h-BN sheet grown on the untreated copper foil was found to have a large number of impurity particles on a surface thereof. As a result of surface roughness measurement, the surface of the h-BN sheet of FIG. 9 was found to be rough with a RMS surface roughness of about 2.42 nm.

Referring to FIG. 10, the h-BN sheet grown on the copper foil that underwent the first thermal treatment and chemical polishing was found to have almost zero impurity particles on a surface thereof. As a result of surface roughness measurement, the surface of the h-BN sheet of FIG. 10 was found to be considerably less rough with a $R_{RMS}$ surface roughness of about 1.10 nm.

Referring to FIG. 11, the h-BN sheet grown on the copper foil that underwent only the first thermal treatment was found to have some impurity particles on a surface thereof. As a result of surface roughness measurement, the surface of the h-BN sheet of FIG. 11 was found to have become smooth with a $R_{RMS}$ surface roughness of about 1.57 nm.

There results indicate that a high-quality h-BN sheet may be grown using a copper foil whose surface is controlled through the first thermal treatment or through the first thermal treatment and chemical polishing.

Experimental Example 4

Raman Spectrum Analysis

Raman spectrum analysis was performed on the h-BN sheets of Comparative Example 1, and Examples 1 and 2. The results are shown in FIGS. 12, 13 and 14, respectively.

Figure 12:
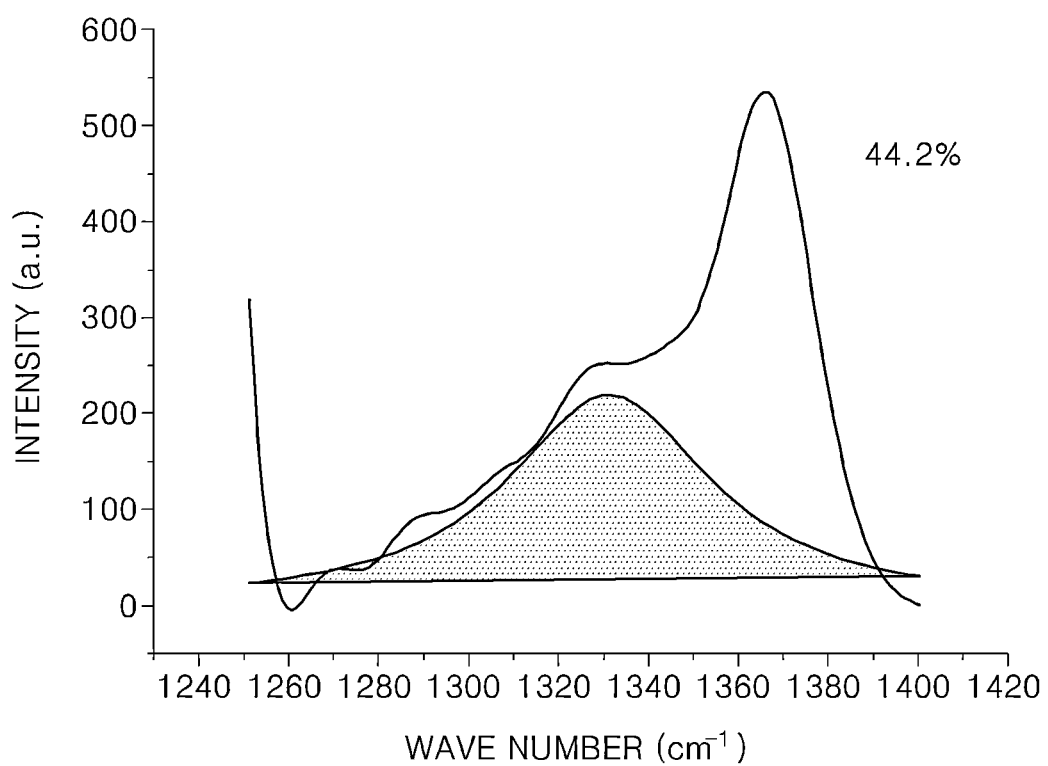
FIG. 12 is graph of intensity (arbitrary units, a.u.) versus wave number (inverse centimeters, $cm^{-1}$) and is a Raman spectrum of the h-BN sheet obtained in Comparative Example 1.

Referring FIG. 12, a peak at 1,367 cm$^{-1}$ indicates the formation of h-BN. In addition, the high intensities of peaks at 1,322 to 1,350 cm$^{-1}$ and a 1,304 cm$^{-1}$ peak indicate the production of many impurities, including c-BN and boron carbon nitride ($B_xC_yN_z$). Thus, the 1,367 cm$^{-1}$ peak from the h-BN sheet of Comparative Example 1 had a high FWHM of about 22.9. A shaded area in a lower part of FIG. 12 indicates a percentage of the other components excluding h-BN. This indicates that the h-BN sheet of Comparative Example 1 had a purity of about 44.2%.

Figure 13:
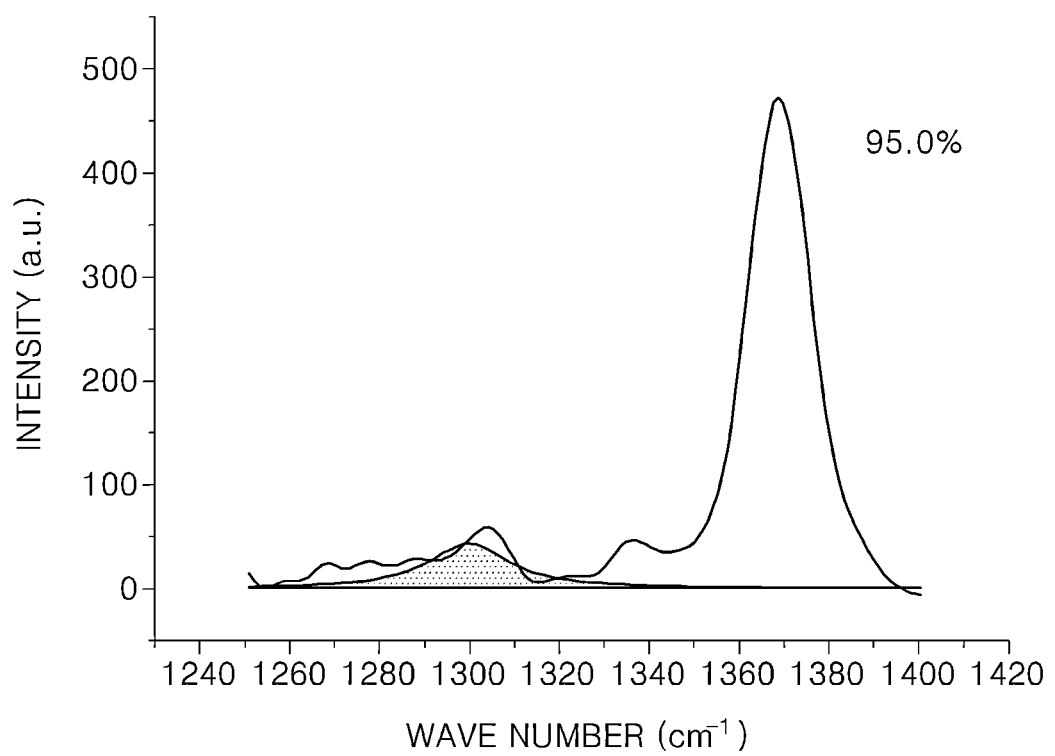
FIG. 13 is graph of intensity (arbitrary units, a.u.) versus wave number (inverse centimeters, $cm^{-1}$) and is a Raman spectrum of the h-BN sheet obtained in Example 1.
Figure 14:
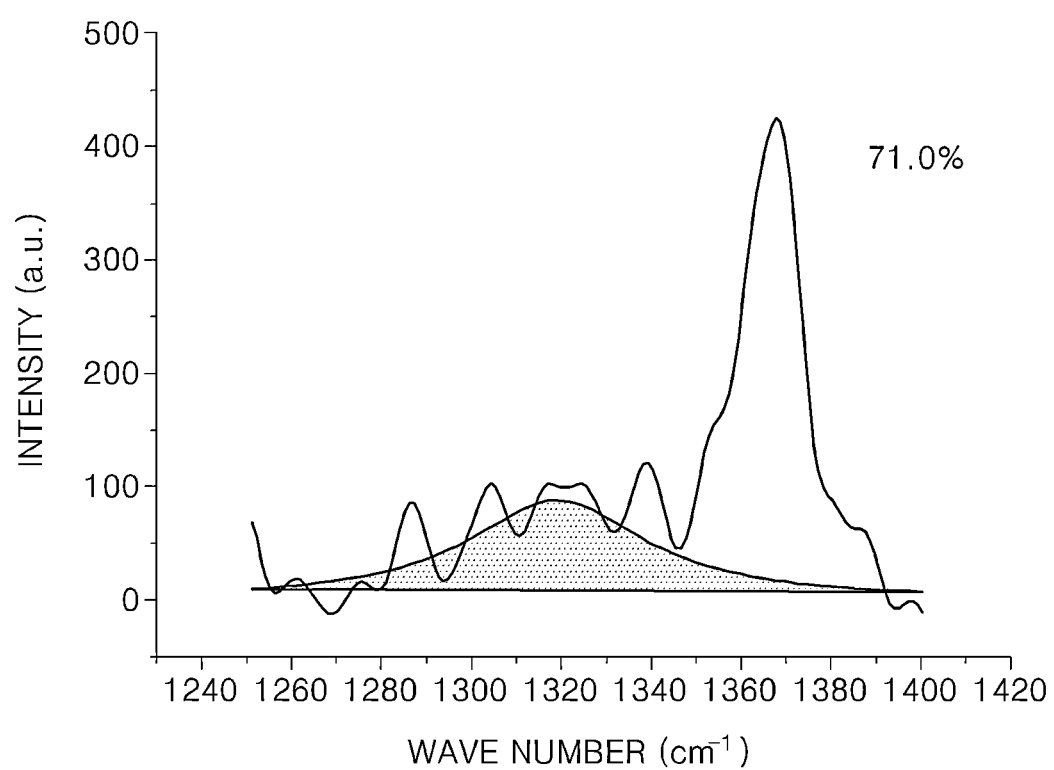
FIG. 14 is graph of intensity (arbitrary units, a.u.) versus wave number (inverse centimeters, $cm^{-1}$) and is a Raman spectrum of the h-BN sheet obtained in Example 2.

Referring to FIG. 13, in the h-BN sheet of Example 1, intensities of peaks from 1,322 to 1,350 cm$^{-1}$ and a 1304 cm$^{-1}$ peak were considerably lower than those of Comparative Example 2, indicating that impurities, including a-BN, c-BN, and boron carbon nitride ($B_xC_yN_z$), are almost zero. Thus, the 1,367 cm$^{-1}$ peak from the h-BN sheet of Example 1 had a lower FWHM of about 14.8. A shaded area in a lower part of FIG. 13 indicates a percentage of the other components excluding h-BN. This indicates that the h-BN sheet of Example 1 had a purity of about 95.0%. Referring to FIG. 14, in the h-BN sheet of Example 2, intensities of peaks at from 1,322 to 1,350 cm$^{-1}$ and a 1304 cm$^{-1}$ peak were considerably lower than those of Comparative Example 2, indicating that a considerable amount of impurities, including a-BN, c-BN and boron carbon nitride ($B_xC_yN_z$), was produced. The 1,367 cm$^{-1}$ peak from the h-BN sheet of Example 2 had a comparatively high FWHM of about 17.2. A solidly shaded area in a lower part of FIG. 14 indicates a percentage of the other components excluding h-BN. This indicates that the h-BN sheet of Example 1 had a purity of about 70.0%.

As is apparent from the Raman spectrum analysis, the h-BN sheets of Examples 1 and 2 that were obtained using the thermally treated metal catalyst had a high purity with nearly zero or merely a small amount of other allotropes, such as c-BN, or a-BN, or boron carbon nitride ($B_xC_yN_z$).

Experimental Example 5 h-BN Sheet Structure Analysis

Figure 15:
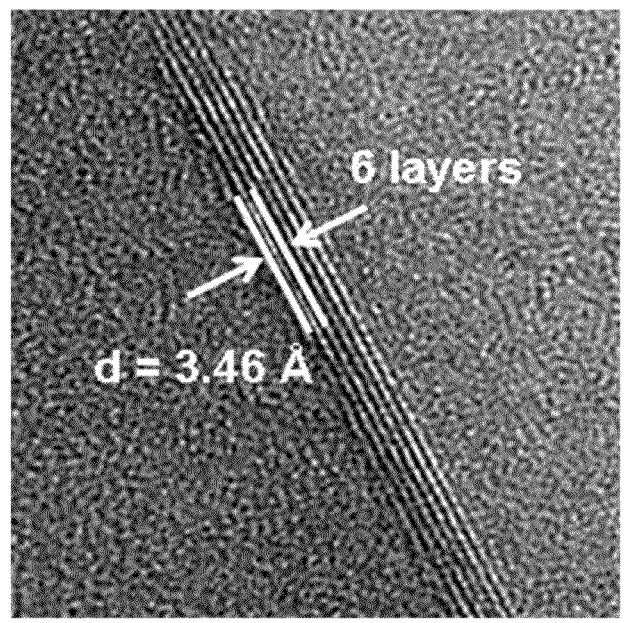
FIG. 15 is a transmission electron microscope (TEM) image of a cross-section of the h-BN sheet of Example 1.

FIG. 15 is a transmission electron microscopic (TEM) image of a cross-section from the h-BN sheet of Example 1.

Referring to FIG. 15, the h-BN sheet of Example 1 was found to include 6 layers with an interlayer distance of about 3.46 Angstroms (Å).

Example 3

Figure 16:
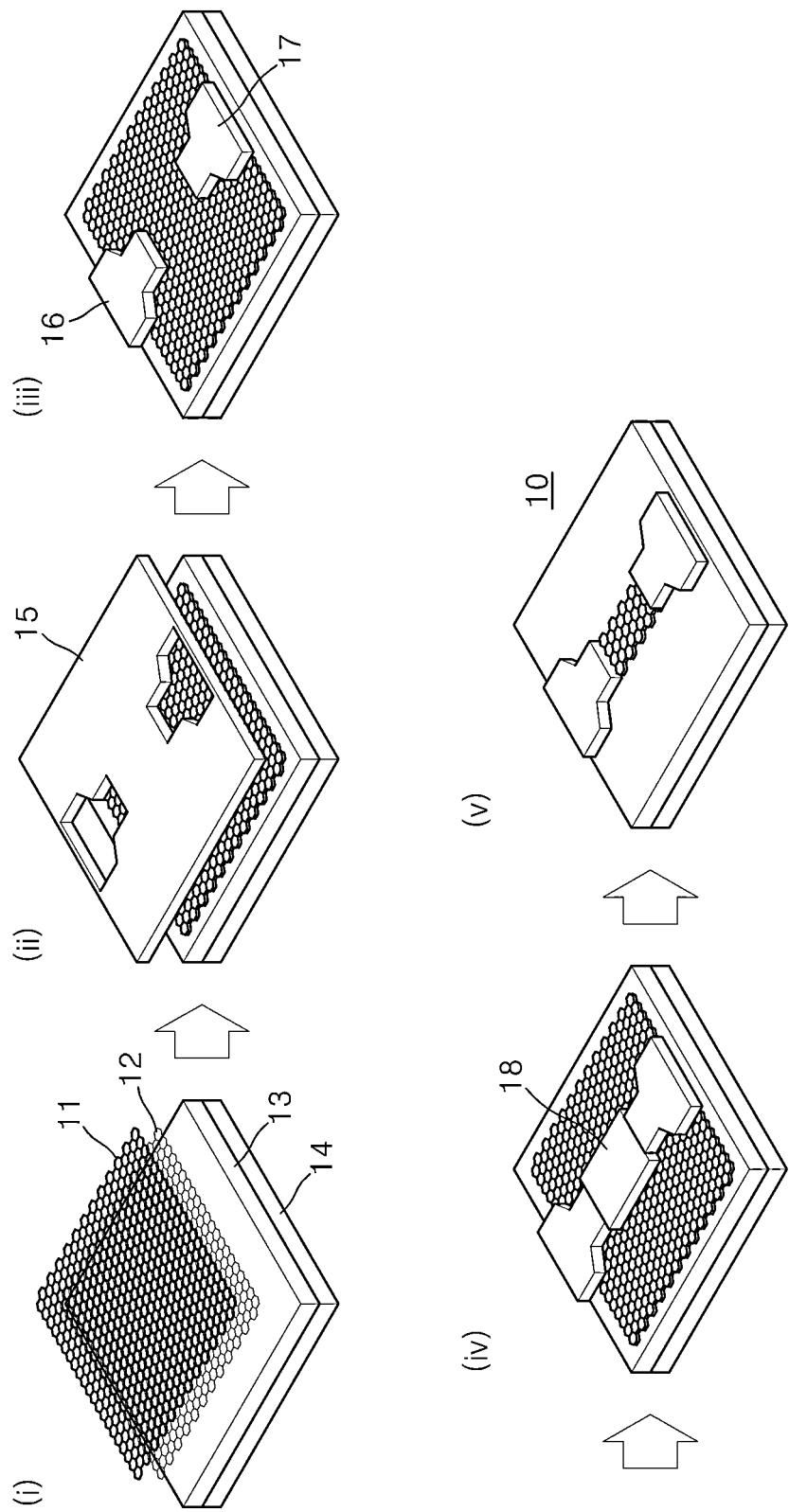
FIG. 16 is a schematic view illustrating an embodiment of a process of manufacturing a graphene-based FET using an h-BN sheet.

A graphene-based field effect transistor (FET) 10 was manufactured using the h-BN sheet of Example 1, according to a process illustrated in FIG. 16.

The PMMA-coated h-BN sheet 12 of Example 1 was transferred onto silicon (n-Si)/silica ($SiO_2$) substrates 13 and 14 having a thickness of about 525 µm and 300 nm, respectively, with a size of about 2.5 cm×2.5 cm, and then the PMMA was removed from the h-BN sheet 12 using acetone. Next, graphene 11 having a monolayer thickness was transferred onto the h-BN sheet 12.

After depositing Au/Ti electrodes 16 and 17 on the graphene 11 via photolithography 15, the graphene 11 and the h-BN sheet 12 were etched by photolithography 18 using $O_2$ plasma, thereby manufacturing a FET structure 10 with a channel length of about 10 µm and a channel width of about 2 µm.

Comparative Example 2

Graphene having a monolayer thickness was transferred onto silicon (n-Si)/silica ($SiO_2$) substrates 13 and 14 having a thickness of about 525 µm and 300 nm, respectively, with a size of about 2.5 cm×2.5 cm.

After depositing Au/Ti electrodes on the graphene 11 via photolithography, the graphene was etched by photolithography using $O_2$ plasma, thereby manufacturing a FET structure with a channel length of about 10 µm and a channel width of about 2 µm.

Experimental Example 6

FET's Electrical Characteristic Analysis

Figure 17:
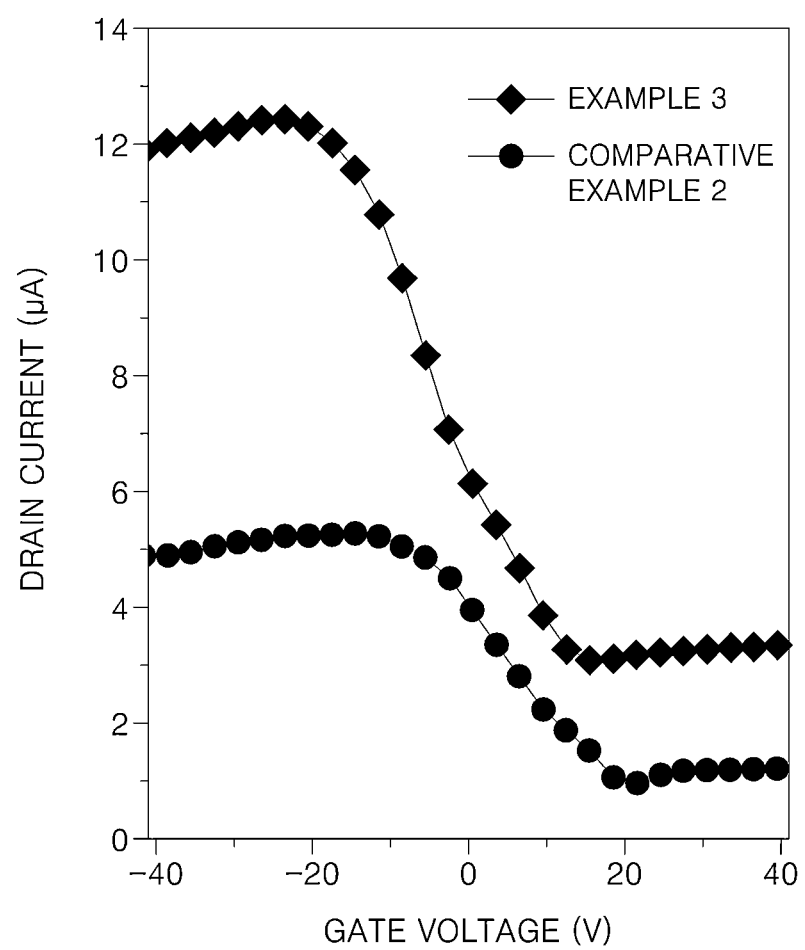
FIG. 17 is a graph of drain current ($I_{DS}$, microamperes, μA) versus gate voltage (Volts, V) of the FET devices manufactured in Example 3 and Comparative Example 2.

The levels of current generated from a source and drain of the FET structures manufactured in Example 3 and Comparative Example 2 when a selected voltage was applied to a gate of each of the FET devices. FIG. 17 is a graph of on-off ratios obtained therefrom. Referring to FIG. 17, the FET structure of Example 3 manufactured using the h-BN sheet was found to have an on-off ratio which was two or more times greater than an on-off ratio of Comparative Example 2. This is attributed to the fact that the h-BN sheet serves as a buffer layer, protecting against scattering of migrating charges in the graphene.

In the current-voltage ($I_{ds}$-$V_g$) plots obtained using the FET structures of Example 3 and Comparative Example 2, the Dirac point (i.e., the inflection point, at which p-type changes to n-type) was at a gate voltage ($V_g$) of 20 volts (V) for the FET device of Comparative Example 3 without the h-BN sheet, and at a $V_g$ of 13 V for the FET device (Example 2) using the h-BN sheet. This is attributed to the fact that the h-BN sheet serves as a buffer layer, protecting scattering of migrating charges in the graphene.

As described above, according to the an embodiment, a high-quality, large-area h-BN sheet may be prepared by vapor deposition using a metal catalyst whose surface is controlled to have a larger grain size and/or reduced surface roughness. The high-quality, large-area h-BN sheet may be applicable in a variety of electronic devices.

It should be understood that the exemplary embodiments described herein should be considered in a descriptive sense only and not for purposes of limitation. Descriptions of features, advantages, or aspects within each embodiment should typically be considered as available for other similar features, advantages or aspects in other embodiments.

What is claimed is:

1. A hexagonal boron nitride sheet having:
   a two-dimensional planar structure with a sp$^2$ B—N covalent bond; and
   a Van der Waals bond between boron-nitrogen layers,
   wherein the hexagonal boron nitride sheet comprises hexagonal boron nitride with a purity of about 70% or greater, when determined by Raman spectroscopy.

2. The hexagonal boron nitride sheet of claim 1, wherein the hexagonal boron nitride sheet comprises from 1 to about 100 boron-nitrogen layers.

3. The hexagonal boron nitride sheet of claim 1, wherein the hexagonal boron nitride sheet has a root mean square surface roughness of about 2 nanometers or less, and a length of about 1 millimeter or greater.

4. The hexagonal boron nitride sheet of claim 1, wherein the hexagonal boron nitride sheet has a peak at 1,367 inverse centimeters with a full width at half maximum of about 17.0 inverse centimeters or less in a Raman spectrum.

5. A method of preparing a hexagonal boron nitride sheet, the method comprising:
preparing a metal catalyst in sheet form;
first thermally treating the metal catalyst to increase a grain size of the metal catalyst;
polishing a surface of the metal catalyst in sheet form after the first thermal treatment; and
second thermally treating and contacting the first thermally treated metal catalyst with a nitrogen source and a boron source to form the hexagonal boron nitride sheet.

6. The method of claim 5, wherein a mean grain area of the metal catalyst in sheet form after the first thermal treatment has a mean increase of about at least 100% or greater than a mean grain area of the metal catalyst before the first thermal treatment.

7. The method of claim 5, wherein the metal catalyst in sheet form after the first thermal treatment has a mean grain area of about 1 square micrometer or greater.

8. The method of claim 5, wherein the metal catalyst in sheet form after the first thermal treatment has a root mean square surface roughness of about 7 nanometers or less.

9. The method of claim 5, wherein the first thermal treatment is performed at a temperature of about a lower temperature to about an upper temperature, wherein the lower temperature is according to Equation 1, $$\text{lower temperature} = (\text{melting point of the metal catalyst} \times 0.60), \text{ and} \qquad \text{Equation 1}$$

the upper temperature is according to Equation 2, $$\text{upper temperature} = (\text{melting point of the metal catalyst} \times 0.97)° C. \qquad \text{Equation 2}$$

10. The method of claim 9, wherein the metal catalyst in sheet form after the first thermal treatment has a mean grain area of about 100 square micrometers to about 5,000 square micrometers.

11. The method of claim 9, wherein the metal catalyst in sheet form after the first thermal treatment has a mean grain area of about 10,000 square micrometers to about 100,000 square micrometers.

12. The method of claim 5, wherein the polishing comprises at least one selected from chemical polishing, physical polishing, chemical mechanical polishing, and electrolytic polishing.

13. The method of claim 5, wherein the metal catalyst in sheet form after the polishing has a root mean square surface roughness of about 5 nanometers or less.

14. The method of claim 5, wherein the metal catalyst in sheet form after the chemical polishing has a root mean square surface roughness of about 1.5 nanometers or less.

15. The method of claim 5, wherein the hexagonal boron nitride sheet has a length of about 1 millimeter or greater.

16. The method of claim 5, wherein the nitrogen source and the boron source are each a vapor.

17. The method of claim 5, wherein the nitrogen source comprises at least one selected from $NH_3$ and $N_2$.

18. The method of claim 5, wherein the boron source comprises at least one selected from $BH_3$, $BF_3$, $BCl_3$, $B_2H_6$, $(CH_3CH_2)_3B$, $(CH_3)_3B$, and diborane.

19. The method of claim 5, wherein the nitrogen source and the boron source comprise at least one selected from $H_3NBH_3$ and $(BH)_3(NH)_3$.

20. The method of claim 5, wherein the metal catalyst is at least one metal selected from nickel, cobalt, iron, platinum, palladium, gold, aluminum, chromium, copper, magnesium, manganese, molybdenum, rhodium, silicon, tantalum, titanium, tungsten, uranium, vanadium, and zirconium, and an alloy thereof.

21. The method of claim 5, wherein the second thermal treatment is performed in the presence of at least one selected from an inert gas and hydrogen gas.

22. A hexagonal boron nitride sheet prepared according to the method of claim 5.

23. A stacked structure comprising:
the hexagonal boron nitride sheet of claim 1; and
graphene.

24. An electronic device comprising the stacked structure of claim 23.

25. A transistor comprising the stacked structure of claim 23.

* * * * *